United States Patent
Kim

(10) Patent No.: US 9,214,452 B2
(45) Date of Patent: Dec. 15, 2015

(54) SEMICONDUCTOR PACKAGE AND METHOD FOR FABRICATING THE SAME

(71) Applicant: SK HYNIX INC., Icheon (KR)

(72) Inventor: Tae Hoon Kim, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/452,305

(22) Filed: Aug. 5, 2014

(65) Prior Publication Data
US 2015/0303175 A1 Oct. 22, 2015

(30) Foreign Application Priority Data
Apr. 18, 2014 (KR) .................. 10-2014-0046992

(51) Int. Cl.
*H01L 23/48* (2006.01)
*H01L 25/065* (2006.01)
*H01L 25/00* (2006.01)
*H01L 23/00* (2006.01)

(52) U.S. Cl.
CPC ............ *H01L 25/0657* (2013.01); *H01L 24/32* (2013.01); *H01L 24/48* (2013.01); *H01L 24/73* (2013.01); *H01L 24/83* (2013.01); *H01L 24/85* (2013.01); *H01L 24/91* (2013.01); *H01L 25/50* (2013.01); *H01L 2224/29099* (2013.01); *H01L 2224/32145* (2013.01); *H01L 2224/48106* (2013.01); *H01L 2224/48225* (2013.01); *H01L 2224/73265* (2013.01); *H01L 2224/832* (2013.01); *H01L 2224/8389* (2013.01); *H01L 2224/852* (2013.01); *H01L 2224/85007* (2013.01); *H01L 2225/0651* (2013.01); *H01L 2225/06555* (2013.01); *H01L 2924/01006* (2013.01)

(58) Field of Classification Search
CPC . H01L 24/83; H01L 24/32; H01L 2924/3025; H01L 33/62; H01L 25/0657; H01L 2924/3011; H01L 2225/06527
See application file for complete search history.

(56) References Cited

U.S. PATENT DOCUMENTS

| 2011/0304015 A1* | 12/2011 | Kim | ...................... H01L 23/552 257/532 |
|---|---|---|---|
| 2012/0126381 A1* | 5/2012 | Uenda | .................... C09J 7/0292 257/659 |

FOREIGN PATENT DOCUMENTS

| KR | 20-0343467 Y1 | 2/2004 |
|---|---|---|
| KR | 10-2005-0103372 A | 10/2005 |
| KR | 10-2011-0075402 A | 7/2011 |

* cited by examiner

*Primary Examiner* — Roy Potter

(57) ABSTRACT

A semiconductor package includes a package substrate on which a substrate pad is disposed, a structure disposed over the package substrate, a semiconductor chip disposed over the structure using an adhesive member having a magnetic material layer disposed therein, a chip pad disposed on a top surface of the semiconductor chip, and a bonding wire coupling the substrate pad and the chip pad.

10 Claims, 16 Drawing Sheets

US 9,214,452 B2

SEMICONDUCTOR PACKAGE AND METHOD FOR FABRICATING THE SAME

CROSS-REFERENCES TO RELATED APPLICATIONS

The present application claims priority to Korean Patent Application Number 10-2014-0046992, filed on Apr. 18, 2014, which is incorporated by reference in its entirety.

BACKGROUND

Embodiments of the present disclosure relate to a semiconductor package, and more particularly, to a semiconductor package and a method for fabricating the same.

Recently, electronic devices have been reduced in size and improved in performance, and the demand for mobile products has increased. Thus, the demand for ultra-small and large-capacity semiconductor packages has also increased. Techniques for increasing a storage capacity of a semiconductor device may include increasing the integration level of a semiconductor chip and mounting a plurality of semiconductor chips in a semiconductor package. Mounting the plurality of semiconductor chips in the semiconductor package enables increasing the storage capacity of the semiconductor device by modifying a packaging process. Thus, the semiconductor industry employs a multi-chip package including a plurality of semiconductor chips to increase the storage capacity of the semiconductor device.

Techniques for forming a multi-chip package may include mounting a plurality of chips disposed in a horizontal direction and mounting a plurality of chips disposed in a vertical direction. Due to the characteristic of electronic devices which need to be reduced in size, a stack type multi-chip package including a plurality of semiconductor chips stacked in one direction packaged therein may be used. The stack type multi-chip package increases density within a limited space by stacking a plurality of semiconductor chips in a vertical direction.

SUMMARY

Various embodiments are directed to semiconductor package and methods of manufacturing the same.

In some embodiments, a semiconductor package may include: a package substrate on which a substrate pad is disposed; a structure disposed over the package substrate; a semiconductor chip attached to the structure using an adhesive member, the adhesive member has a magnetic material layer disposed therein; a chip pad disposed on a top surface of the semiconductor chip; and a bonding wire coupling the substrate pad and the chip pad.

According to further embodiments, a method for fabricating a semiconductor package may include: preparing a package substrate on which a substrate pad is disposed; disposing a lower structure over the package substrate; preparing a semiconductor chip on which a chip pad is disposed, the chip pad being disposed on top surface of an edge part of the semiconductor chip; disposing the semiconductor chip over the lower structure with an adhesive member disposed between the semiconductor chip and the lower structure such that the semiconductor chip has an overhang structure in which the edge part protrudes from a side of the lower structure, the adhesive member having a magnetic material layer disposed therein; applying a magnetic field to the magnetic material layer so as to support the semiconductor chip; and forming a bonding wire to couple the substrate pad and the chip pad while the semiconductor chip is supported by the magnetic field.

DESCRIPTION OF SPECIFIC EMBODIMENTS

Embodiments of the present disclosure will hereinafter be described in detail with reference to the accompanying drawings. It should be noted that the drawings are not to precise scale and may be exaggerated in thickness of lines or sizes of components for descriptive convenience and clarity. Furthermore, the terms as used herein are defined by taking functions of the embodiments into account and may vary according to the custom or intention of users or operators. Therefore, the terms should be interpreted according to the overall disclosures set forth herein.

Figure 1:
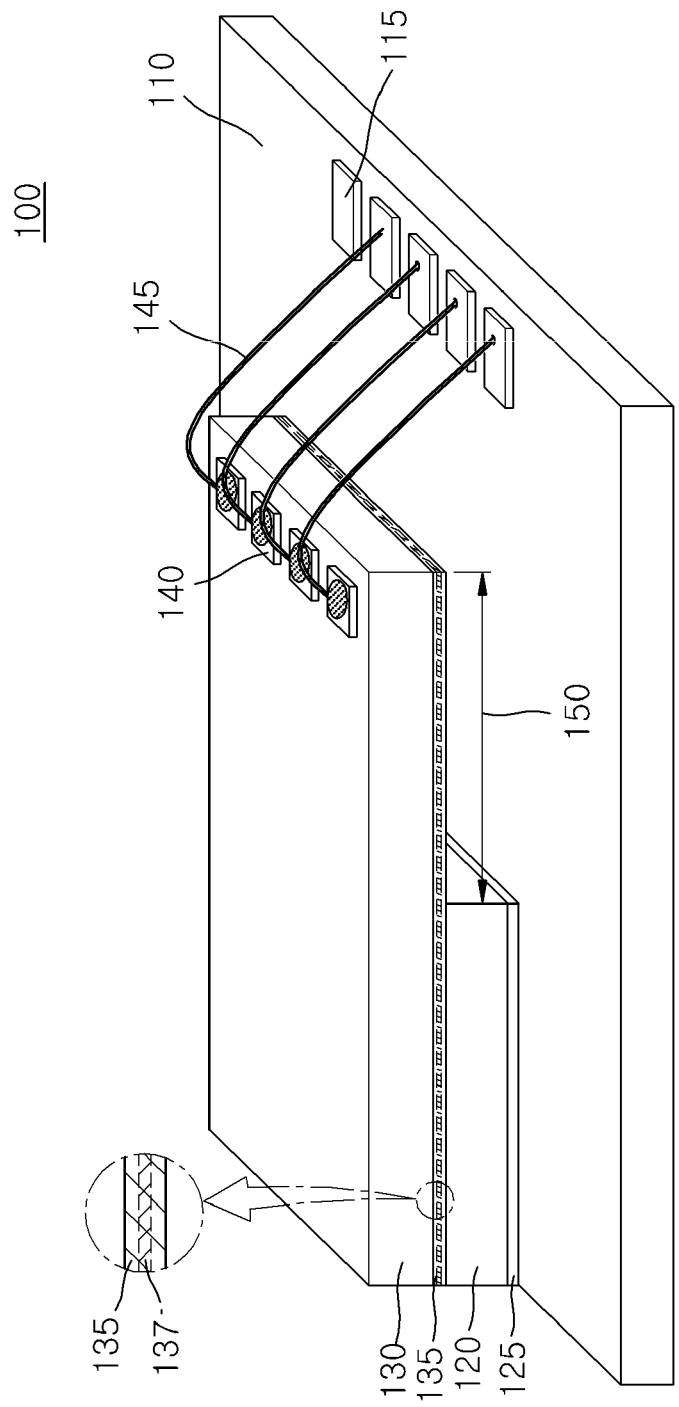
FIG. 1 is a perspective view of a semiconductor package in accordance with an embodiment of the present disclosure.

FIG. 1 is a perspective view of a semiconductor package in accordance with an embodiment of the present disclosure. The semiconductor package 100 includes a package substrate 110, a plurality of substrate pads 115, first and second stacked semiconductor chips 120 and 130, first and second adhesive members 125 and 135, a plurality of chip pads 140, and a bonding wire 145.

The second adhesive member 135 is positioned between the first and second semiconductor chips 120 and 130 so as to bond the first semiconductor chip 120 to the second semiconductor chip 130. The second adhesive member 135 includes a magnetic material layer 137 disposed therein.

The package substrate 110 may include a printed circuit board (PCB) or flexible PCB, and may include semiconductor chips or integrated circuit chips mounted thereon. The package substrate 110 includes a front side and a back side facing the front side. Although not illustrated in FIG. 1, the package substrate 110 may include circuit wiring patterns arranged therein.

The plurality of substrate pads 115 is disposed on the front side of the package substrate 110 to electrically couple the first and second semiconductor chips 120 and 130 to the package substrate 110. The substrate pads 115 may transmit electrical signals to the back side of the package substrate 110 through the circuit wiring patterns arranged in the package substrate 110. The package substrate 110 may include coupling wirings (not illustrated) such as coupling vias for coupling the circuit wiring patterns.

The number of substrate pads 115 illustrated in FIG. 1 is illustrative and embodiments are not limited thereto. In another embodiment, the number of substrate pads 115 may be adjusted depending on the use of the semiconductor package. The substrate pad 115 may include a conductive material, for example, copper (Cu), nickel (Ni), gold (Au), silver (Ag), or the like.

The first and second semiconductor chips 120 and 130 may be arranged over the package substrate 110. In an embodiment, the first and second semiconductor chips 120 and 130 may be stacked in such a manner that the first semiconductor chip 120 is attached over the package substrate 110 using the first adhesive member 125 and the second semiconductor chip 130 is attached over the first semiconductor chip 120 using the second adhesive member 135. Although not illustrated in FIG. 1, additional semiconductor chips may be stacked over the second semiconductor chip 130.

In the present embodiment, the structure disposed under the second semiconductor chip 130 is the first semiconductor chip 120 only, but embodiments are not limited thereto. In another embodiment, the structure disposed under the second semiconductor chip 130 may include a dummy chip or an insulating layer such as a solder resist layer. In still another embodiment, the structure disposed under the second semiconductor chip 130 may include two or more semiconductor chips. Thus, in some embodiments, two or more semiconductor chips, two or more dummy chips, or two or more insulating layers may be independently stacked, or mixed and stacked.

The first and second semiconductor chips 120 and 130 may be stacked along a first direction of the package substrate 110. In an embodiment, the first and second semiconductor chips 120 and 130 may be arranged in such a manner that edge parts thereof deviate from each other. Thus, the edge part 150 of the second semiconductor chip 130 disposed over the first semiconductor chip 120 does not overlap with the first semiconductor chip 120, but instead protrudes from the edge part of the first semiconductor chip 120 in a lateral direction. That is, the second semiconductor chip 130 may be stacked to have an overhang structure over the first semiconductor chip 120.

The plurality of chip pads 140 is disposed on the second semiconductor chip 130 to couple the package substrate 110 and the second semiconductor chip 130. The chip pads 140 arranged on the second semiconductor chip 130 may be disposed on the edge part 150 of the second semiconductor chip 130 having the overhang structure. The first and second semiconductor chips 120 and 130 may include silicon (Si). The number and arrangement of the chip pads 140 illustrated in FIG. 1 are not limited thereto. In another embodiment, the number and arrangement of the chip pads 140 may be changed according to a type of the second semiconductor chip 130.

The bonding wire 145 couples the chip pad 140 to the substrate pad 115. Thus, the second semiconductor chip 130 may be electrically coupled to the package substrate 110 via the chip pad 140, the bonding wire 145, and the substrate pad 115. The bonding wire 145 may include a conductive metal such as copper (Cu), gold (Au), silver (Ag), or the like.

As described above, the first semiconductor chip 120 and the package substrate 110 may be attached to each other using the first adhesive member 125, and the first semiconductor chip 120 and the second semiconductor chip 130 may be attached to each other using the second adhesive member 135. Any of the first and second adhesive members 125 and 135 may include an adhesive tape, for example, a die attach film (DAF). The second adhesive member 135 may include the magnetic material layer 137 disposed therein.

The magnetic material layer 137 may include a magnetic material such as a ferromagnetic material, a ferrimagnetic material, graphene, or the like. The ferromagnetic material may include nickel (Ni), cobalt (Co), steel (Fe), or the like, and the ferrimagnetic material may include magnetite, ferrite, or the like. The magnetic material layer 137 may be formed of a material which does not continuously generate a magnetic force, but instead generates a magnetic force only when exposed to a magnetic field, wherein the magnetic field may be produced when a magnetic force generator for generating a magnetic force is turned on. The second adhesive member 135 having the magnetic material layer 137 disposed therein is disposed on the back side of the second semiconductor chip 130, including the back side of the edge part 150 of the second semiconductor chip 130 having the overhang structure.

The magnetic material layer 137 may have various shapes when disposed in the second adhesive member 135, some of which shapes will be described with reference to FIGS. 2 to 4.

Figure 2:
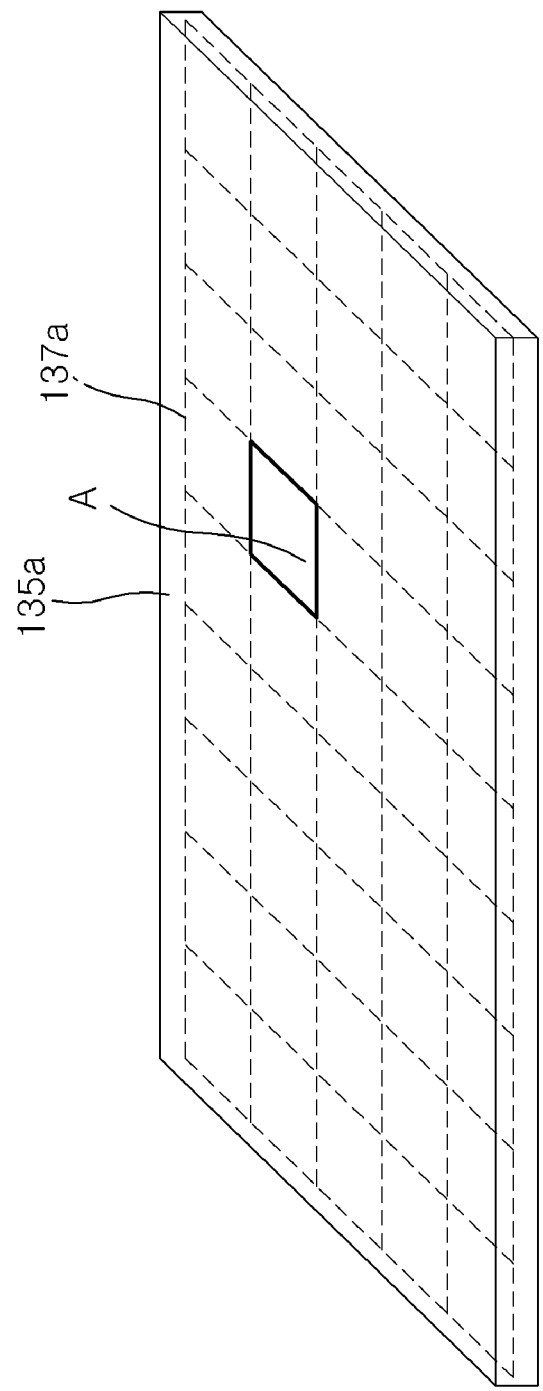
FIGS. 2 to 4 show a magnetic material layer disposed in an adhesive member according to an embodiment.

FIG. 2 shows an embodiment having a magnetic material layer 137a disposed within an adhesive member 135a. The magnetic material layer 137a has a lattice pattern A in which a plurality of line-shaped patterns formed of a magnetic material are arranged to cross each other. The lattice pattern A may include one or more square, rectangle, or polygon shapes.

Figure 3:
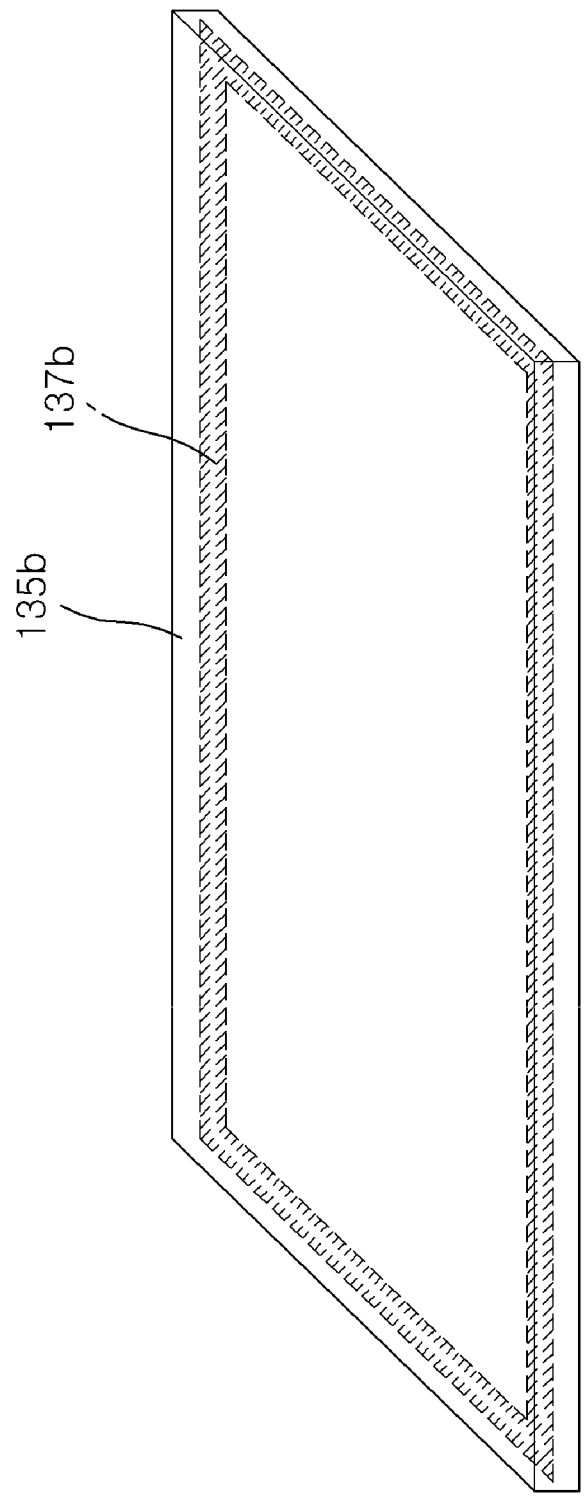

FIG. 3 shows an embodiment having a magnetic material layer 137b disposed within an adhesive member 135b. The magnetic material layer 137b is disposed only at one or more edges of the adhesive member 135b. The magnetic material layer 137b may have a line-shaped border disposed near or along the edges of the adhesive member 135b.

Figure 4:
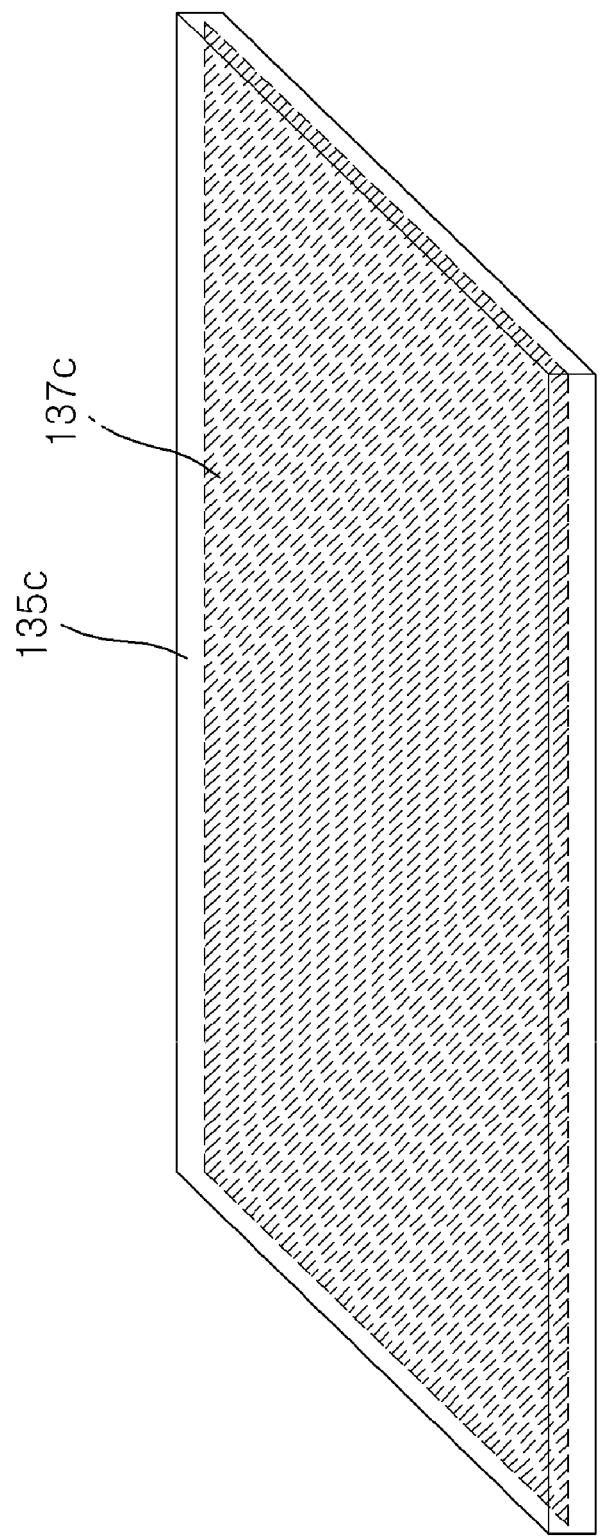

FIG. 4 shows an embodiment having a magnetic material layer 137c disposed within the adhesive member 135c. The magnetic material layer 137c has a plate shape.

Figure 5:
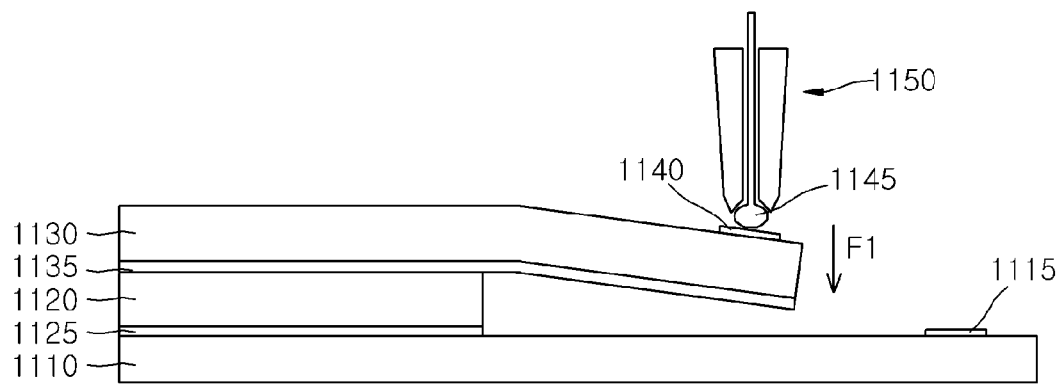
FIG. 5 illustrates a wire bonding process.

FIG. 5 illustrates a portion of a wire bonding process of bonding both ends of a bonding wire to a chip pad of a semiconductor chip and a substrate pad of a package substrate, respectively, while a capillary is moved. In FIG. 5, first and second stacked semiconductor chips 1120 and 1130 are disposed on a package substrate 1110. A pad 1115 is disposed on the package substrate 1110. The first semiconductor chips 1120 is attached over the package substrate 1110 using a first adhesive member 1125 and the second semiconductor chips 1130 is attached over the first semiconductor chip 1120 using a second adhesive member 1135.

The first and second adhesive members 1125 and 1135 includes an adhesive tape, for example, a die attach film (DAF). Neither the first adhesive member 1125 nor the second adhesive member 1135 have a magnetic material layer therein.

As illustrated in FIG. 5, a wire ball 1145 is formed at an end of a capillary 1150 so as to couple a bonding wire to a chip pad 1140 disposed on the second semiconductor chip 1130, and a force F1 is generated through the capillary 1150 and applied to press the wire ball 1145 to the chip pad 1140 in order to bond the wire ball 1145 to the chip pad 1140.

When the force F1 is applied to the chip pad 1140 through the wire ball 1145, the second semiconductor chip 1130 is bent toward a package substrate 1110. When the force F1 applied to the chip pad 1140 is removed, the second semiconductor chip 1130 bent toward the package substrate 1110 tends to be restored to the original state. However, when the second semiconductor chip 1130 is bent beyond a critical value for restoration before being restored to the original state, a crack may be generated in the second semiconductor chip 1130. Furthermore, while the second semiconductor chip 1130 is being restored, the bonding wire may be bent or cut.

On the other hand, a semiconductor package in accordance with an embodiment, such as the package 100 shown in FIG. 1, employs the second adhesive member 135 having the magnetic material layer 137 disposed therein to substantially prevent the second semiconductor chip 130 from being bent during the wire bonding process. Specifically, when a magnetic force generator for generating a magnetic force is turned on, the magnetic material 137 generates a magnetic force, and the attractive force between the second adhesive member 135 having the magnetic material layer 137 disposed therein and the magnetic force generator may be used to substantially prevent the second semiconductor chip 130 from being bent beyond the critical value.

Figure 7:
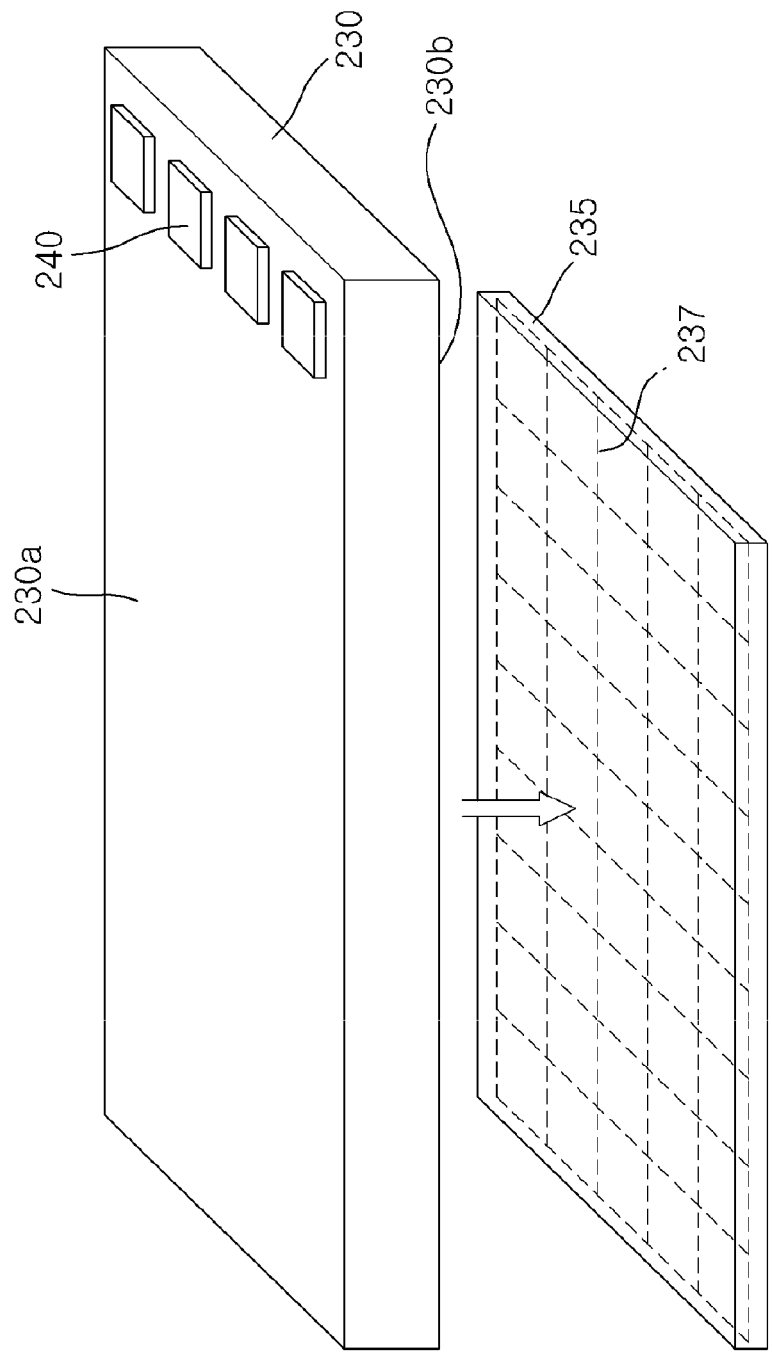
Figure 8:
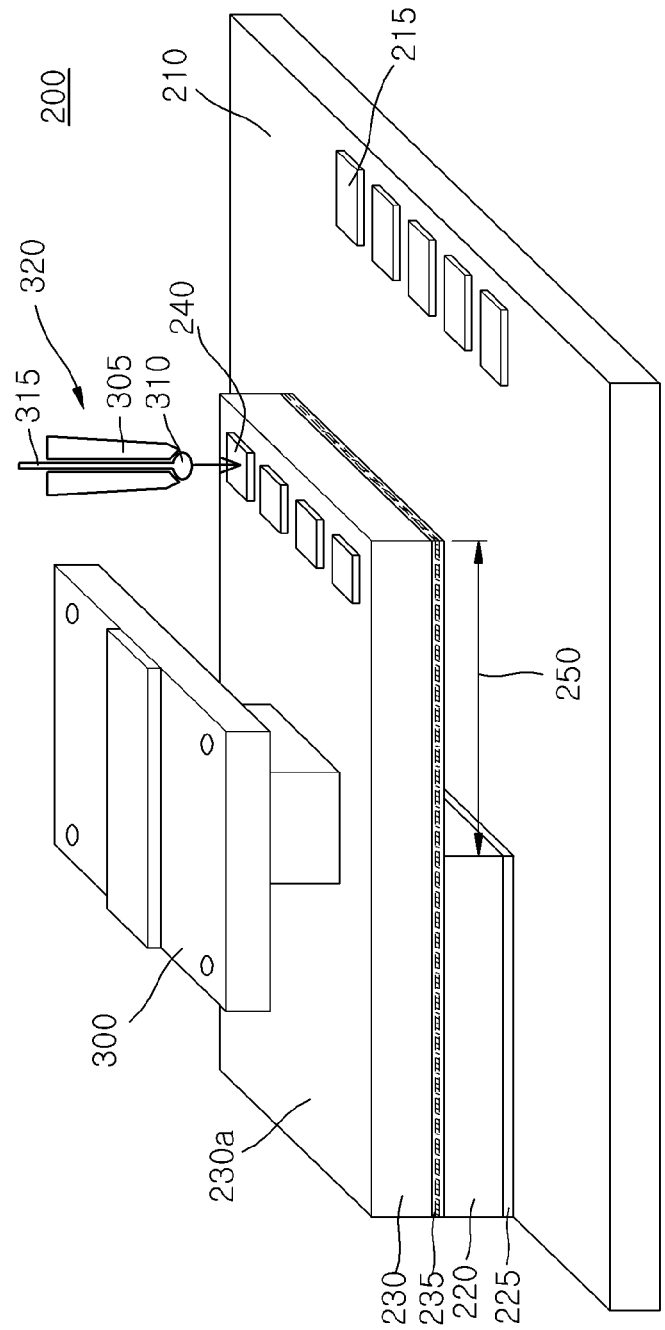
Figure 9:
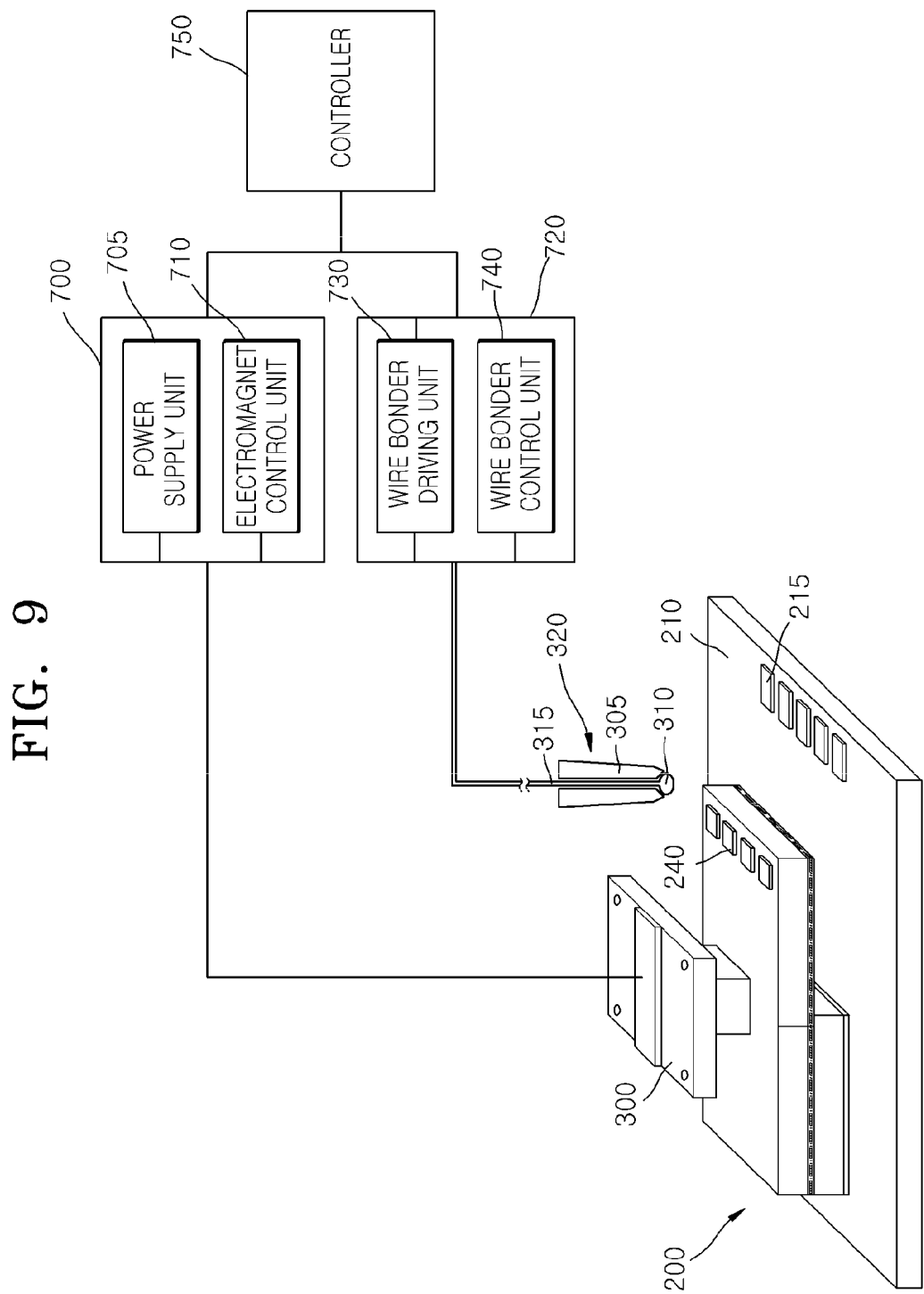

FIGS. 6 through 11 are diagrams for explaining a process for fabricating a semiconductor package in accordance with various embodiments. FIG. 9 illustrates a wire bonding apparatus in accordance with an embodiment.

Figure 6:
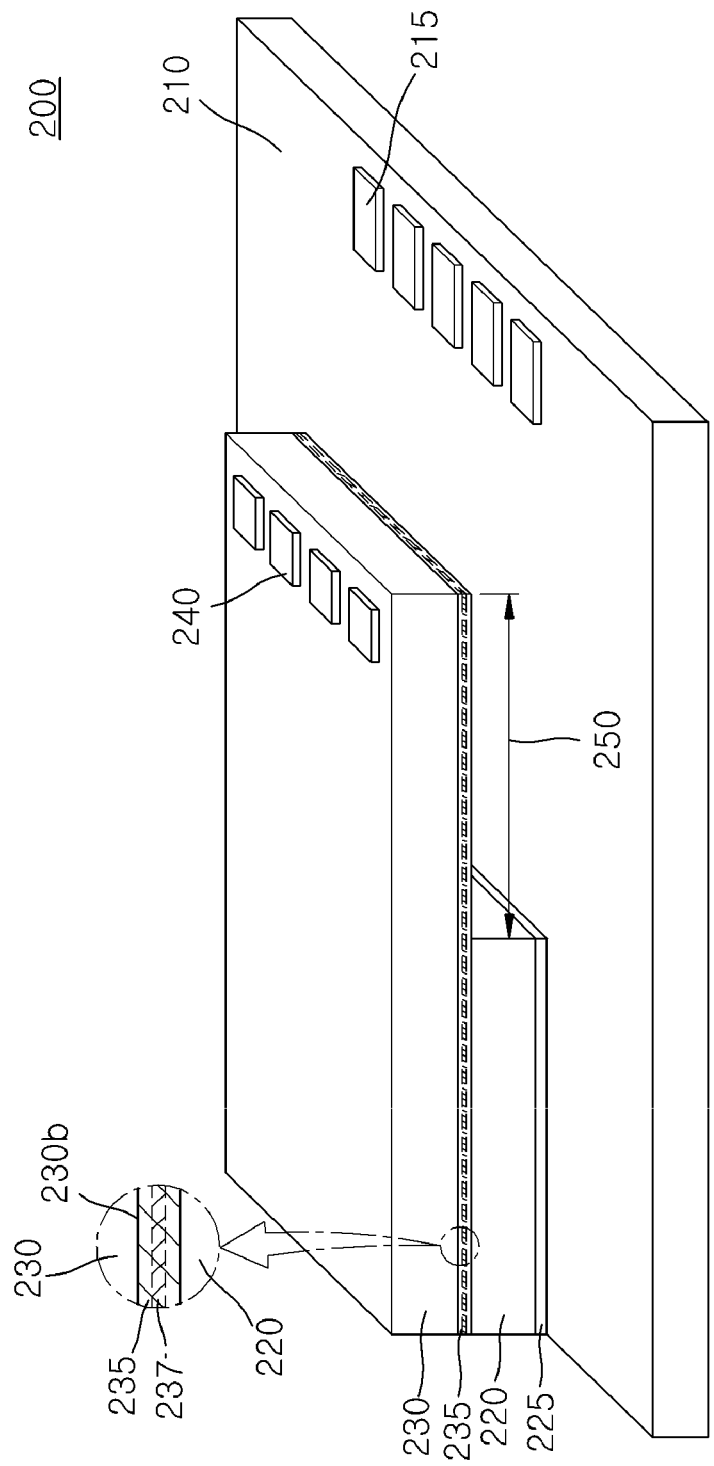
FIGS. 6 through 11 illustrate a process for fabricating a semiconductor package in accordance with an embodiment.

Referring to FIGS. 6 and 7, first and second semiconductor chips 220 and 230 are stacked over a package substrate 210. In an embodiment, the package substrate 210 may include a PCB or flexible PCB. Although not illustrated in the drawings, the package substrate 210 may include circuit wiring patterns arranged therein so as to transmit electrical signals between semiconductor chips in the semiconductor package and the outside. A plurality of substrate pads 215 is formed on a top surface of the package substrate 210 so as to electrically couple the package substrate 210 to the first and second semiconductor chips 220 and 230.

The first semiconductor chip 220 is attached over the package substrate 210 using a first adhesive member 225, and the second semiconductor chip 230 is attached over the first semiconductor chip 220 using a second adhesive member 235 formed on a back-side surface 230b of the second semiconductor chip 230. The second semiconductor chip 230 has an edge part 250 that does not overlap with the first semiconductor chip 220 disposed under the second semiconductor chip 230 but instead protrudes from an edge part of the first semiconductor chip 220 in a lateral direction. That is, the second semiconductor chip 230 may be disposed over the first semiconductor chip 220 with an overhang structure.

Although not illustrated in FIG. 6, additional semiconductor chips may be stacked over the second semiconductor chip 230. In the present embodiment, the structure disposed under the second semiconductor chip 230 includes the first semiconductor chip 220 only, but embodiments are not limited thereto. In another embodiment, the structure disposed under the second semiconductor chip 230 may include a dummy chip or an insulating layer such as a solder resist layer. In an embodiment, the first adhesive member 225 may include an adhesive tape, such as a DAF, or an adhesive.

Referring to FIG. 7, the second adhesive member 235 attached on the back-side surface 230b of the second semiconductor chip 230 includes an adhesive tape, for example, a DAF. The second adhesive member 235 includes a magnetic material layer 237 disposed therein. The magnetic material layer 237 disposed in the second adhesive member 235 may include a material which reacts when a magnetic force generator for generating a magnetic force operates.

In an embodiment, the magnetic material layer 237 may include a magnetic material such as a ferromagnetic material, a ferrimagnetic material, graphene, or the like. The ferromagnetic material may include nickel (Ni), cobalt (Co), steel (Fe) or the like. The ferrimagnetic material may include magnetite, ferrite, or the like.

The magnetic material layer 237 may be formed in various patterns, such as those illustrated for magnetic material layer 137 in FIGS. 2 through 4.

A plurality of chip pads 240 is formed on a top surface 230a of the second semiconductor chip 230 for coupling the package substrate 210 to the second semiconductor chip 230. The chip pads 240 disposed on the second semiconductor chip 230 may be disposed on the edge part 250 of the second semiconductor chip 230 having the overhang structure. The number of chip pads 240 illustrated in FIG. 7 is not limited thereto. In another embodiment, the number of chip pads 240 may be adjusted according to types of the first and second semiconductor chips 220 and 230.

Referring to FIGS. 8 and 9, a wire bonding apparatus including a magnetic force generator 300 and a wire bonder 320 is disposed at the semiconductor package 200. The wire bonder 320 may be positioned over the semiconductor package 200. The magnetic force generator 300 is moved to be in contact with the top surface 230a of the second semiconductor chip 230. The magnetic force generator 300 is positioned on the edge part 250 of the second semiconductor chip 230 having the overhang structure.

The magnetic force generator 300 may include an electromagnet (not illustrated). The electromagnet may be formed by winding a conductor around a cylindrical bobbin to form a coil. A current may be passed through the electromagnet to generate a magnetic force.

The operation of the magnetic force generator 300 may be controlled by a first controller 700 including a power supply unit 705 and an electromagnet control unit 710. The power supply unit 705 controls a power source to pass a current to the magnetic force generator 300 or block the current. The electromagnet control unit 710 controls the current flowing through the electromagnet of the magnetic force generator 300 and thereby controls the intensity of the magnetic force.

The wire bonder 320 may include a capillary 305 having an empty space disposed therein. Through the empty space of the capillary 305, a wire 315 may be supplied. Although not illustrated in FIG. 9, the capillary 305 may be moved in up and down directions or left and right directions by a driving unit. The operation of the wire bonder 320 may be controlled by a second controller 720 including a wire bonder driving unit 730 and a wire bonder control unit 740. The wire bonder driving unit 730 controls the driving unit to move the capillary 305. The wire bonder control unit 740 generates an electrical spark at an end of the wire 315 so as to form a wire ball 310, and supplies the wire 315.

A controller 750 controls the first and second controllers 700 and 720 so as to control the entire wire bonding process.

Figure 10:
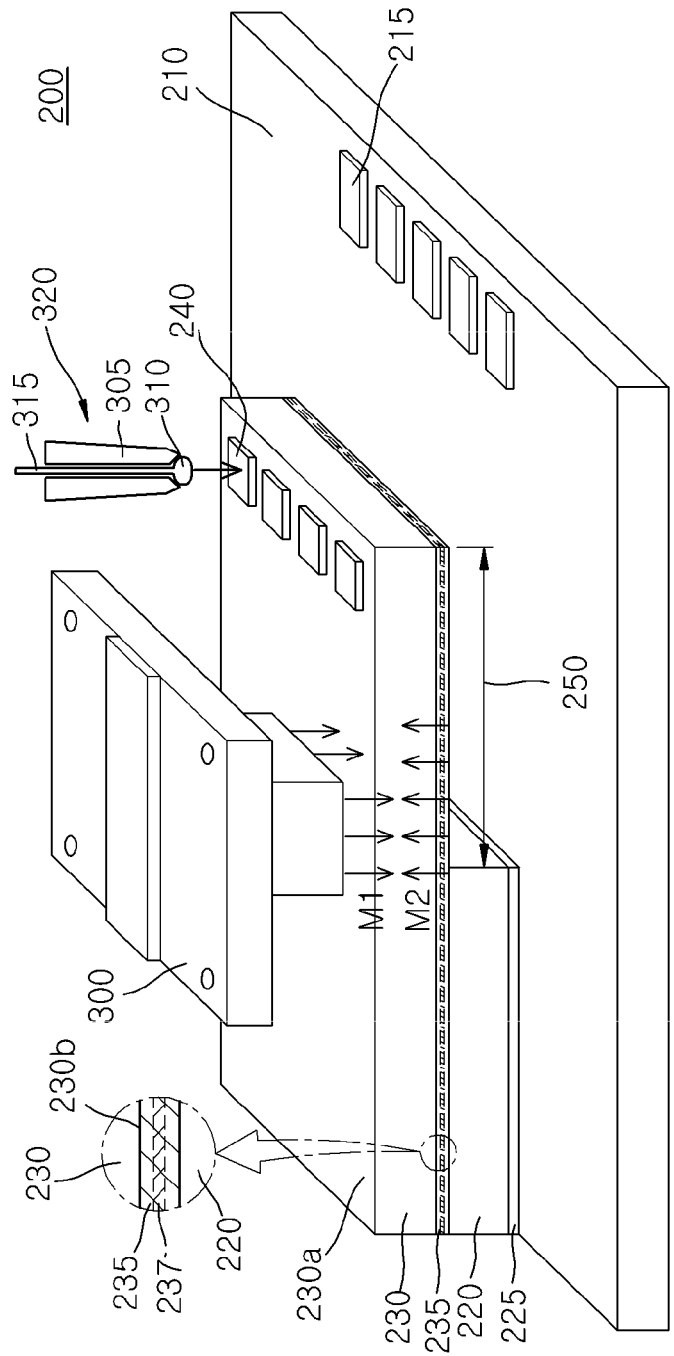

Referring to FIG. 10, the power supply unit 705 of FIG. 9 provides a current to the electromagnet within the magnetic force generator 300 to generate a first magnetic force. The first magnetic force is generated in a first direction M1 through the interaction between the magnetic force generator 300 contacting the top surface 230a of the edge part 250 of the second semiconductor chip 230 and the magnetic material layer 237 disposed in the second adhesive member 235. The first direction M1 indicates a direction in which the semiconductor package 200 including the second semiconductor chip 230 is disposed.

When the magnetic force generator 300 generates the first magnetic force in the first direction M1, the magnetic material layer 237 disposed in the second adhesive member 235 attached on the back-side surface 230b of the second semiconductor chip 230 generates a second magnetic force in response. The magnetic material layer 237 generates the second magnetic force in a second direction M2, that is, toward the magnetic force generator 300. Although the magnetic material layer 237 generates the second magnetic force toward the magnetic force generator 300, because the magnetic force generator 300 contacts the edge part 250 of the second semiconductor chip 230, the second semiconductor chip 230 is not bent upward but is instead substantially fixed in a horizontal direction during the wire bonding process.

While the second semiconductor chip 230 is supported by the second magnetic force, the capillary 305 of the wire bonder 320 is lowered until it contacts the chip pad 240. In order to attach the wire ball 310 to the chip pad 240, a predetermined force is applied to press the wire ball 310 to the chip pad 215 through the capillary 305. The semiconductor package 200 in accordance with the embodiment employs the second adhesive member 235 including the magnetic material layer 237, and thus generates an attractive force between the magnetic force generator 300 and the second adhesive member 235. As a result, the edge part 250 of the second semiconductor chip 230 having the overhang structure may be supported and prevented from being bent substantially downward. Thus, damage such as cracks may be substantially prevented from occurring while the second semiconductor chip 230 is bent and restored.

Figure 11:
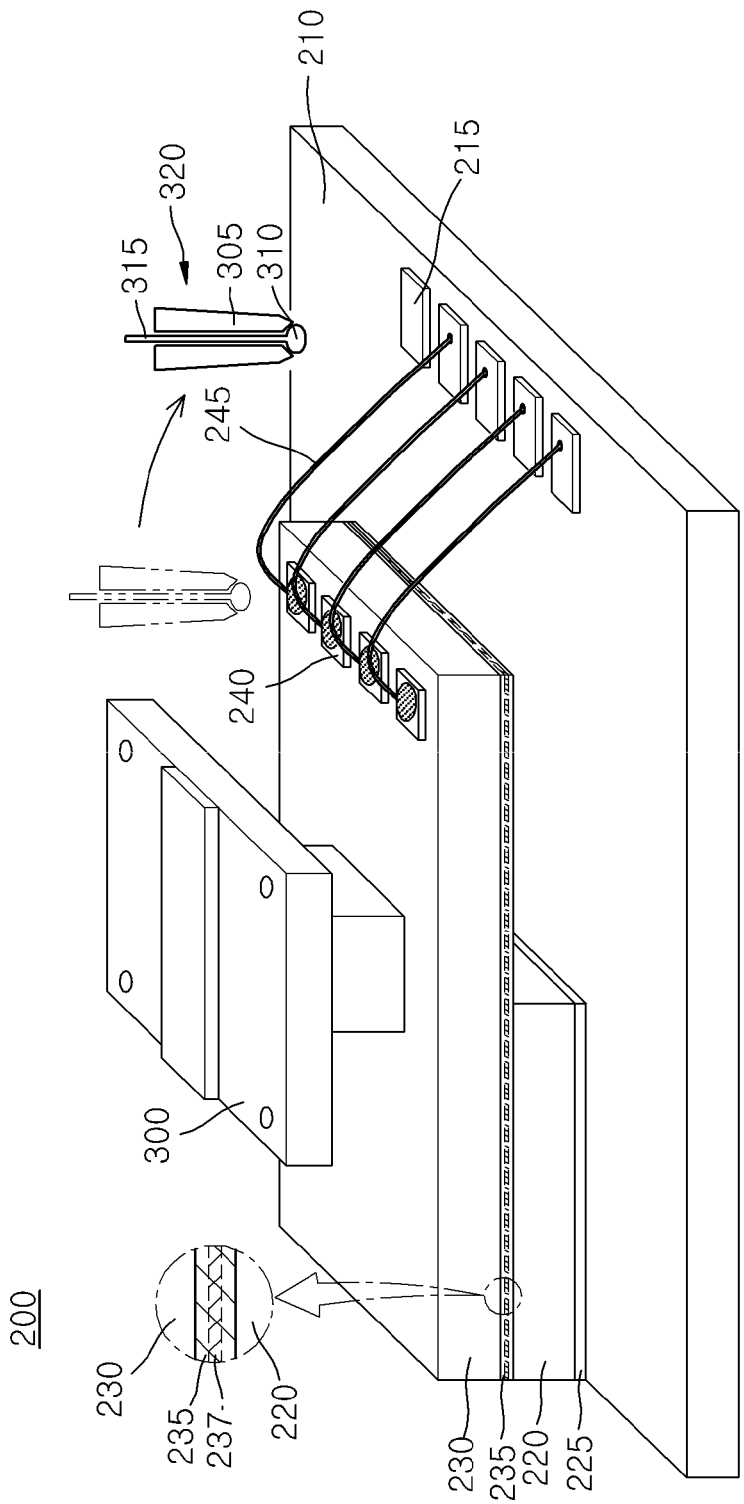

As illustrated in FIG. 11, the capillary 305 that contacted the chip pad 240 is subsequently lifted and moved in a transverse direction, and then lowered toward a substrate pad 215. Initially, the capillary 305 is in contact with the chip pad 240 and is then lifted. During this process, a loop shape may be formed. As the capillary 305 is lowered and contacts the substrate pad 215, a bonding wire 245 is formed. The capillary 305 applies a predetermined force to attach the bonding wire 245 to the substrate pad 215 so that the chip pad 240 and the substrate pad 215 are coupled to each other through the bonding wire 245.

Subsequently, the capillary 305 is lifted and the bonding wire 245 is cut to complete the wire bonding process. When the wire bonding process is completed, the magnetic force generator 300 is separated from the top surface 230a of the second semiconductor chip 230.

In an embodiment, the wire bonding process is performed with the magnetic force generator 300 disposed at a predetermined height from the top surface 230a of the second semiconductor chip 230. When a current is supplied to the electromagnet within the magnetic force generator 300 to generate a magnetic force and the magnetic force generator 300 is separated from the second semiconductor chip 230, the magnetic material layer 237 disposed in the second adhesive member 235 generates a magnetic force, that is, an attractive force, towards the magnetic force generator 300. The attractive force generated may prevent substantial movement of the second semiconductor chip 230 during the wire bonding process.

Figure 12:
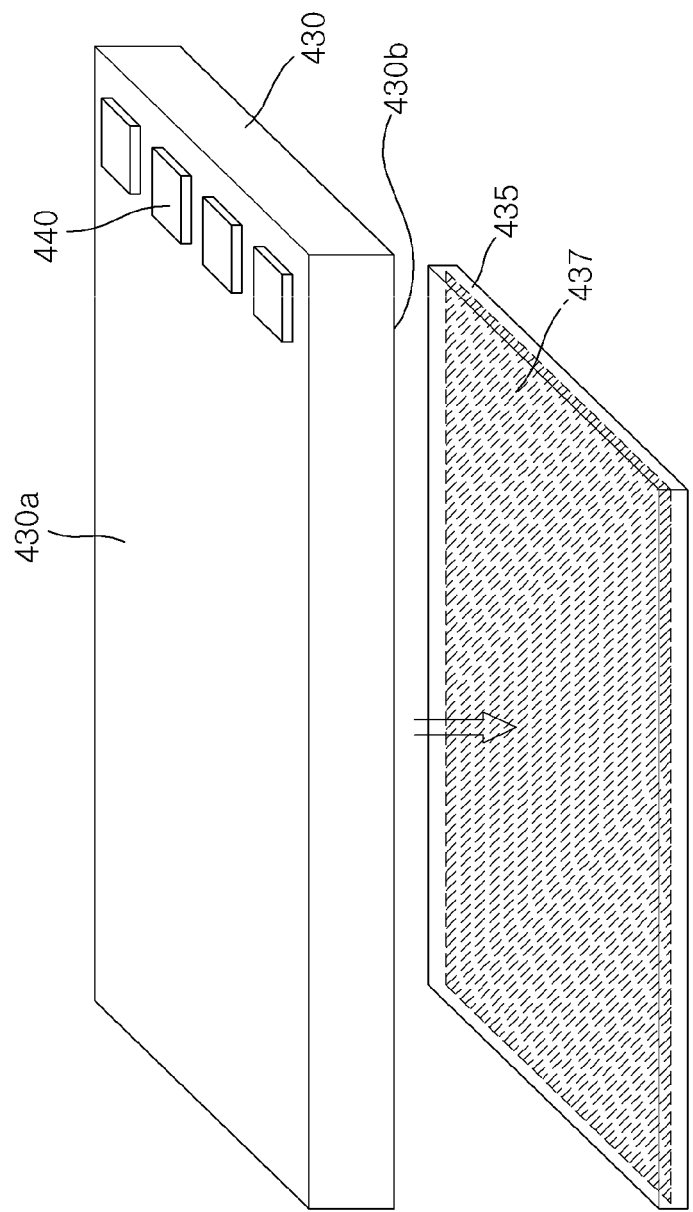
FIGS. 12 and 13 illustrate a process for fabricating a semiconductor package in accordance with another embodiment.
Figure 13:
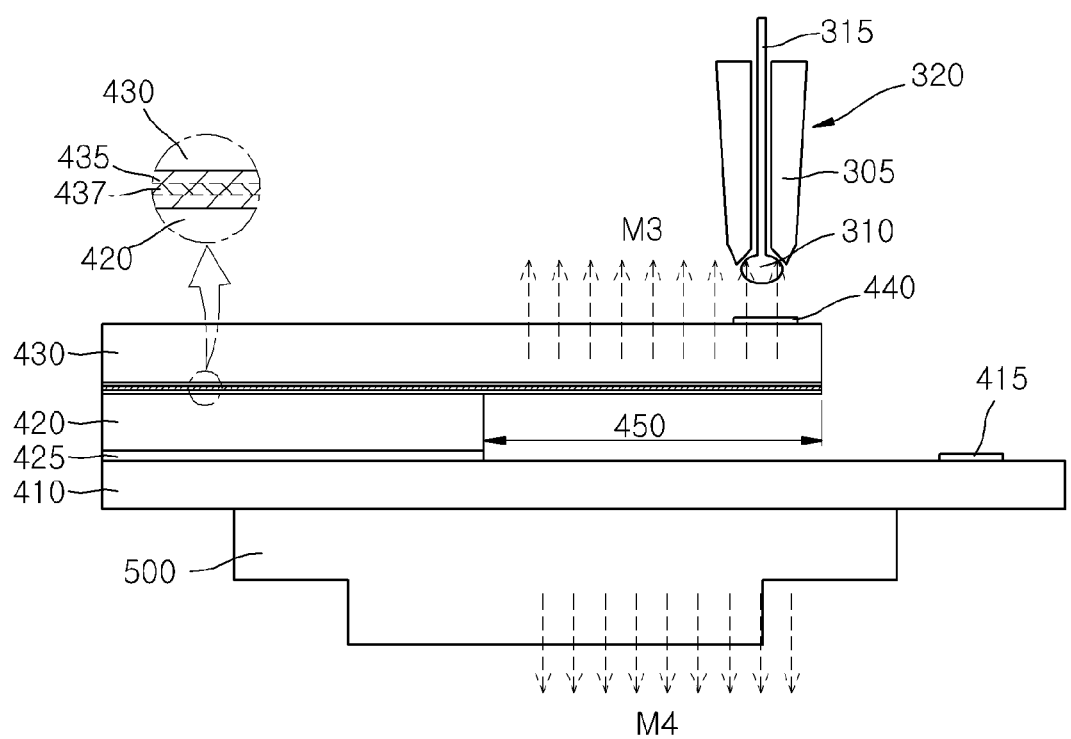

FIGS. 12 and 13 are diagrams for explaining a process for fabricating a semiconductor package in accordance with another embodiment.

FIG. 13 shows first and second semiconductor chips 420 and 430 stacked over a package substrate 410. The package substrate 410 may include a PCB or flexible PCB. A plurality of substrate pads 415 is formed on a front-side surface of the package substrate 410 so as to electrically couple the package substrate 410 to the first and second semiconductor chips 420 and 430.

A first polarity plate 500 is disposed on a back-side surface of the package substrate 410. The first polarity plate 500 may be defined as a plate formed of a conductor serving as an anode (+) or cathode (−).

The first semiconductor chip 420 is attached over the package substrate 410 using a first adhesive member 425, and the second semiconductor chip 430 is attached over the first semiconductor chip 420 using a second adhesive member 435 attached on the back-side surface 430b of the second semiconductor chip 430. A plurality of chip pads 440 is formed on a top surface 430a of the second semiconductor chip 430. The chip pads 440 may be disposed on an edge part 450 of the second semiconductor chip 430 having an overhang structure. Although not illustrated in the drawings, additional semiconductor chips may be stacked over the second semiconductor chips 430 and/or may be disposed between the first and second semiconductor chips 420 and 430. The first adhesive member 425 may include an adhesive tape, such as, a DAF, or an adhesive.

As shown in FIG. 12, the second adhesive member 435 attached on the back-side surface 430b of the second semiconductor chip 430 may include an adhesive tape, for example, a DAF. The second adhesive member 435 may have a second polarity plate 437 disposed therein. The second polarity plate 437 may be defined as a plate formed of a conductor serving an anode (+) or cathode (−). The second polarity plate 437 may have the same polarity as the first polarity plate 500. For example, when the first polarity plate 500 has a positive electric potential (+), the second polarity plate 437 may have a positive electric potential (+), and when the first polarity plate 500 has a negative (−) electric potential, the second polarity plate 437 may have a negative (−) electric potential.

When the first and second polarity plates 500 and 437 having the same polarity are positioned on the back-side surface of the package substrate 410 and in the second adhesive member 435 of the second semiconductor chip 230, respectively, and arranged to face each other, repulsive forces M3 and M4 are generated between the first and second polarity plates 500 and 437. The end part 450 of the second semiconductor chip 430 having the overhang structure is supported by the repulsive forces M3 and M4 generated between the first and second polarity plates 500 and 437. Thus, when the capillary 305 of the wire bonder 320 applies a predetermined force to attach the wire ball 310 to the chip pad 440 during the wire bonding process, the second semiconductor chip 430 may be prevented from being substantially bent. When the wire bonding process is completed, the first polarity plate 500 disposed on the back-side surface of the package substrate 410 is removed.

Figure 14:
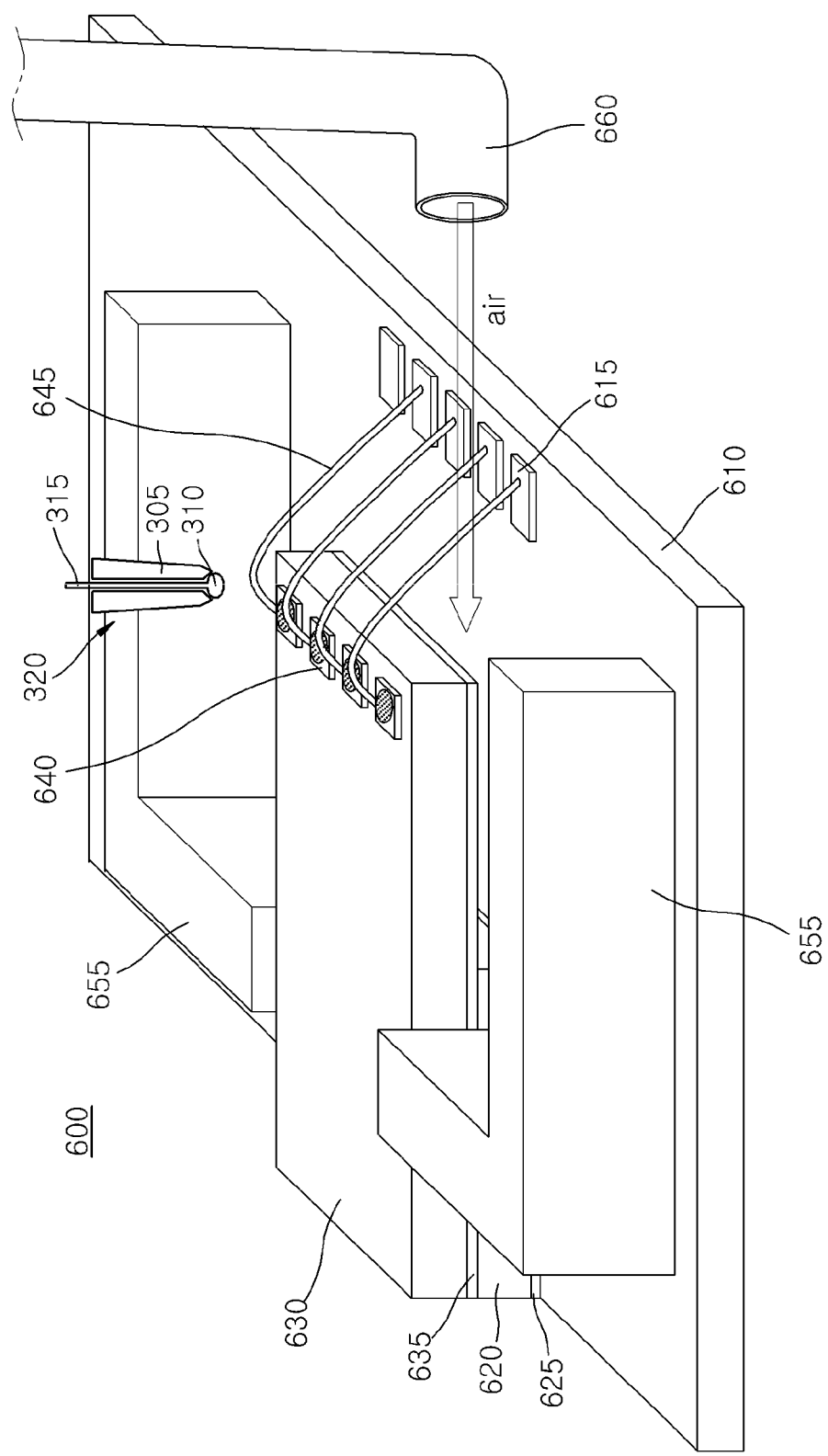
FIGS. 14 and 15 illustrate a process for fabricating a semiconductor package in accordance with another embodiment.
Figure 15:
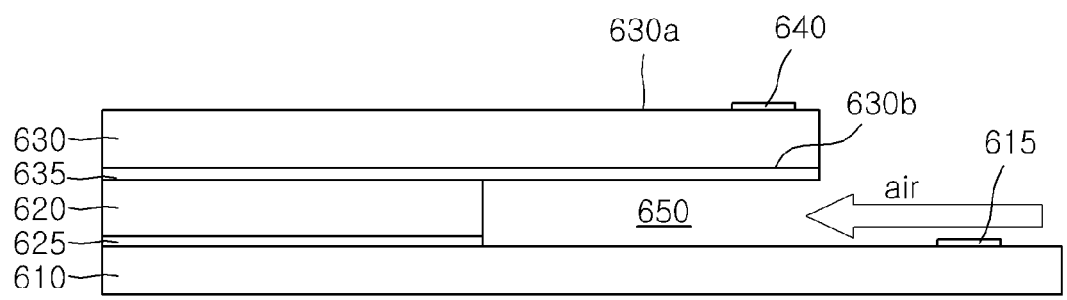

FIGS. 14 and 15 are diagrams for explaining a process for fabricating a semiconductor package in accordance with another embodiment.

Referring to FIGS. 14 and 15, the semiconductor package 600 includes first and second semiconductor chips 620 and 630 stacked over a package substrate 610. A plurality of substrate pads 615 is formed on a top surface of the package substrate 610 so as to electrically couple the package substrate 610 to the first and second semiconductor chips 620 and 630.

The first semiconductor chip 620 may be attached over the package substrate 610 using a first adhesive member 625, and the second semiconductor chip 630 may be attached over the first semiconductor chip 620 using a second adhesive member 635 formed on a back-side surface 630b of the second semiconductor chip 630. A plurality of chip pads 640 is formed on a top surface 630a of the second semiconductor chip 630. The chip pads 640 may be disposed on an edge part of the second semiconductor chip 630 having an overhang structure. Although not illustrated in the drawings, additional semiconductor chips may be stacked over the second semiconductor chip 630 and/or may be disposed between the first and second semiconductor chips 620 and 630. Any of the first and second adhesive members 625 and 635 may include an adhesive tape, such as a DAF, or an adhesive.

Over the package substrate 610, air dams 655 may be disposed. The air dams 655 may be disposed over the package substrate 610 on the left and right sides of the stacked structure of the first and second semiconductor chips 620 and 640, with the stacked structure interposed therebetween.

Then, an air injection device 660 and the capillary 305 of the wire bonder 320 are disposed over the semiconductor package 600. Air is supplied toward the second semiconductor chip 630 from the air injection device 660. The air supplied from the air injection device 660 is injected into a space 650 under the edge part of the second semiconductor chip 630 having the overhang structure. Then, while the air is retained in the space 650 under the edge part of the second semiconductor chip 630 by the air dams 655 disposed with the stacked structure of the first and second semiconductor chips 620 and 630 interposed therebetween, the second semiconductor chip 630 is supported by the air as if a support structure existed under the second semiconductor chip 630.

The above-described wire bonding process using the capillary 305 is used to form a metal wire 645 for coupling a chip pad 640 to a substrate pad 615. As the air is continuously injected into the space 650 under the edge part of the second semiconductor chip 630 having the overhang structure while the wire bonding process is performed, the second semiconductor chip 630 may be prevented from being substantially bent by the force applied by the capillary 305.

When the wire bonding process is completed, the air injection process of the air injection device 660 is stopped. The air dams 645 may be removed after the wire bonding process.

The packages described above may be applied to various electronic systems.

Figure 16:
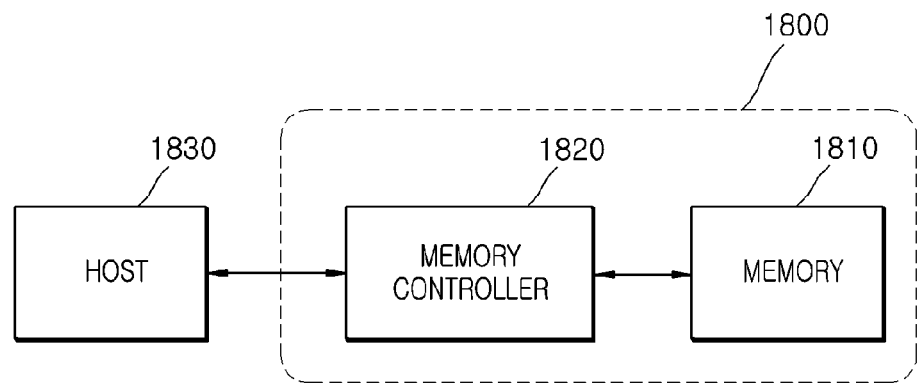
FIG. 16 is a block diagram illustrating an electronic system including a package according to an embodiment.

Referring to FIG. 16, the package in accordance with the embodiments may be provided in the form of a memory card 1800. For example, the memory card 1800 may include a memory 1810 such as a nonvolatile memory device and a memory controller 1820. The memory 1810 and the memory controller 1820 may store data or read stored data.

The memory 1810 may include at least any one among nonvolatile memory devices to which the packaging technologies of the embodiments of the present disclosure are applied. The memory controller 1820 may control the memory 1810 such that stored data is read out or data is stored in response to a read/write request from a host 1830.

Figure 17:
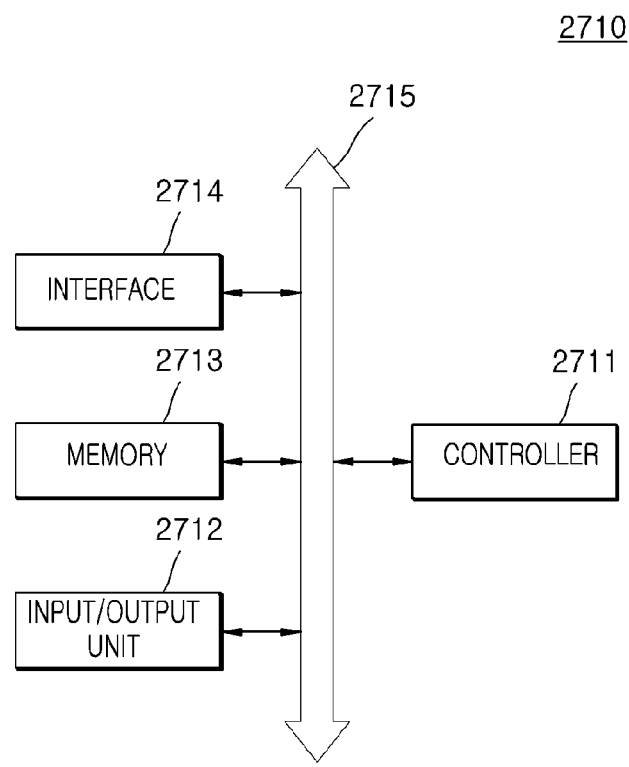
FIG. 17 is a block diagram illustrating another electronic system including a package according to an embodiment.

Referring to FIG. 17, the package in accordance with an embodiment may be applied to an electronic system 2710. The electronic system 2710 may include a controller 2711, an input/output unit 2712, and a memory 2713. The controller 2711, the input/output unit 2712, and the memory 2713 may be coupled with one another through a bus 2715 providing a path through which data are transmitted.

For example, the controller 2711 may include at least any one of a microprocessor, a digital signal processor, a microcontroller, and logic devices capable of performing the same functions as these components. At least one of the controller 2711 and the memory 2713 may include at least any one of the packages according to the embodiments of the present disclosure. The input/output unit 2712 may include at least one selected among a keypad, a keyboard, a display device, a touch screen and so forth. The memory 2713 is a device for storing data. The memory 2713 may store data and/or commands to be executed by the controller 2711, and the like.

The memory 2713 may include a volatile memory device such as a DRAM and/or a nonvolatile memory device such as a flash memory. For example, a flash memory may be mounted to an information processing system such as a mobile terminal or a desk top computer. The flash memory may constitute a solid state disk (SSD). In this case, the electronic system 2710 may stably store a large amount of data in a flash memory system.

The electronic system 2710 may further include an interface 2714 suitable for transmitting and receiving data to and from a communication network. The interface 2714 may be a wired or wireless type. For example, the interface 2714 may include an antenna or a wired or wireless transceiver.

The electronic system 2710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

In an embodiment wherein the electronic system 2710 is an equipment capable of performing wireless communication, the electronic system 2710 may be used in a communication system such as a system employing one or more of CDMA (code division multiple access), GSM (global system for mobile communications), NADC (North American digital cellular), E-TDMA (enhanced-time division multiple access), WCDMA (wideband code division multiple access), CDMA2000, LTE (long term evolution), and Wibro (wireless broadband Internet).

Although preferred embodiments of the present disclosure have been disclosed for illustrative purposes, those skilled in the art will appreciate that various modifications, additions, and substitutions are possible, without departing from the scope and spirit of the present disclosure as defined in the accompanying claims.

What is claimed is:

1. A method for fabricating a semiconductor package, the method comprising:
preparing a package substrate on which a substrate pad is disposed;
disposing a lower structure over the package substrate;
preparing a semiconductor chip on which a chip pad is disposed, the chip pad being disposed on a top surface of an edge part of the semiconductor chip;
disposing the semiconductor chip over the lower structure with an adhesive member disposed between the semiconductor chip and the lower structure such that the semiconductor chip has an overhang structure in which the edge part protrudes from a side of the lower structure, the adhesive member having a magnetic material layer disposed therein;
applying a magnetic field to the magnetic material layer so as to support the semiconductor chip; and
forming a bonding wire to couple the substrate pad and the chip pad while the semiconductor chip is supported by the magnetic field.

2. The method of claim 1, wherein the lower structure comprises another semiconductor chip.

3. The method of claim 1, wherein the adhesive member is disposed on a back-side surface of the semiconductor chip, the back-side surface being opposite the top surface.

4. The method of claim 1, wherein the magnetic material layer comprises one or more of a ferromagnetic material, a ferrimagnetic material, and graphene.

5. The method of claim 1, wherein the magnetic material layer is formed in a lattice shape in which a plurality of line-shaped patterns formed of a magnetic material are arranged to cross each other.

6. The method of claim 1, wherein the magnetic material layer includes a line-shaped border disposed near a plurality of edges of the adhesive member.

7. The method of claim 1, wherein the magnetic material layer includes a plate shape with a surface structure.

8. The method of claim 1, wherein the supporting of the semiconductor chip comprises:
   contacting a magnetic force generator with a top surface of the semiconductor chip;
   supplying a current to the magnetic force generator to generate the magnetic field; and
   supporting the semiconductor chip using a magnetic force generated through interaction between the magnetic field generated by the magnetic force generator and the magnetic material layer within the adhesive member.

9. The method of claim 8, wherein the magnetic force generator is in contact with the protruding edge part of the semiconductor chip having the overhang structure.

10. The method of claim 8, wherein the generating of the magnetic field is performed at the same time as the forming of the bonding wire.

\* \* \* \* \*